US009490199B2

(12) United States Patent
Long et al.

(10) Patent No.: US 9,490,199 B2
(45) Date of Patent: Nov. 8, 2016

(54) INTERPOSER WITH PROGRAMMABLE MATRIX FOR REALIZING CONFIGURABLE VERTICAL SEMICONDUCTOR PACKAGE ARRANGEMENTS

(71) Applicant: Infineon Technologies AG, Neubiberg (DE)

(72) Inventors: Theng Chao Long, Melaka (MY); Tian San Tan, Melaka (MY); Wan Yee Ng, Seremban (MY); Kong Sin Chong, Melaka (MY)

(73) Assignee: Infineon Technologies AG, Neubiberg (DE)

(*) Notice: Subject to any disclaimer, the term of this patent is extended or adjusted under 35 U.S.C. 154(b) by 101 days.

(21) Appl. No.: 14/194,916

(22) Filed: Mar. 3, 2014

(65) Prior Publication Data

US 2015/0249047 A1    Sep. 3, 2015

(51) Int. Cl.
*H01L 23/498* (2006.01)
*H01L 25/065* (2006.01)
*H01L 23/00* (2006.01)

(52) U.S. Cl.
CPC ......... *H01L 23/49844* (2013.01); *H01L 24/36* (2013.01); *H01L 24/40* (2013.01); *H01L 25/0657* (2013.01); *H01L 2224/0603* (2013.01); *H01L 2224/40245* (2013.01); *H01L 2224/48091* (2013.01); *H01L 2224/48247* (2013.01); *H01L 2224/73221* (2013.01); *H01L 2924/12042* (2013.01); *H01L 2924/13091* (2013.01); *H01L 2924/181* (2013.01)

(58) Field of Classification Search
CPC .................. H01L 23/49844; H01L 25/0657

USPC ........................................................ 257/678
See application file for complete search history.

(56) References Cited

U.S. PATENT DOCUMENTS

| | | | | |
|---|---|---|---|---|
| 5,558,928 | A * | 9/1996 | DiStefano | H01L 21/4857 174/258 |
| 5,917,229 | A * | 6/1999 | Nathan | G01R 1/04 257/529 |
| 7,115,986 | B2 * | 10/2006 | Moon | H01L 23/4985 257/686 |
| 7,728,415 | B2 | 6/2010 | Hosseini et al. | |
| 8,334,586 | B2 | 12/2012 | Otremba et al. | |
| 2008/0150105 | A1 * | 6/2008 | Hosseini | H01L 23/49562 257/676 |

OTHER PUBLICATIONS

U.S. Appl. No. 13/786,525, filed Jun. 3, 2013.

* cited by examiner

*Primary Examiner* — Kenneth Parker
*Assistant Examiner* — Warren H Kilpatrick
(74) *Attorney, Agent, or Firm* — Murphy, Bilak & Homiller, PLLC

(57) ABSTRACT

An interposer for establishing a vertical connection between semiconductor packages includes an electrically insulating substrate having a first main side and a second main side opposite the first main side, a plurality of first electrical conductors at the first main side of the substrate, a plurality of second electrical conductors at the second main side of the substrate, and a programmable connection matrix at one or both main sides of the substrate. The programmable connection matrix includes programmable junctions configured to open or close electrical connections between different ones of the first electrical conductors and different ones of the second electrical conductors upon programming of the junctions.

19 Claims, 16 Drawing Sheets

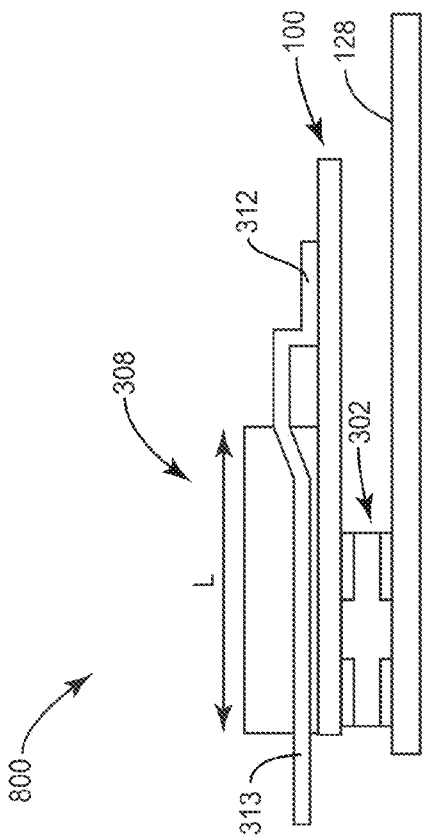
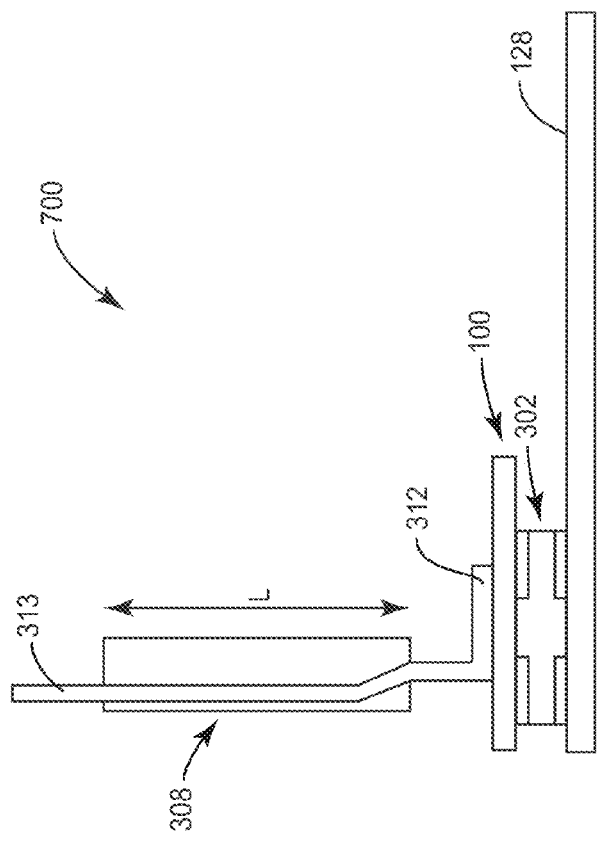

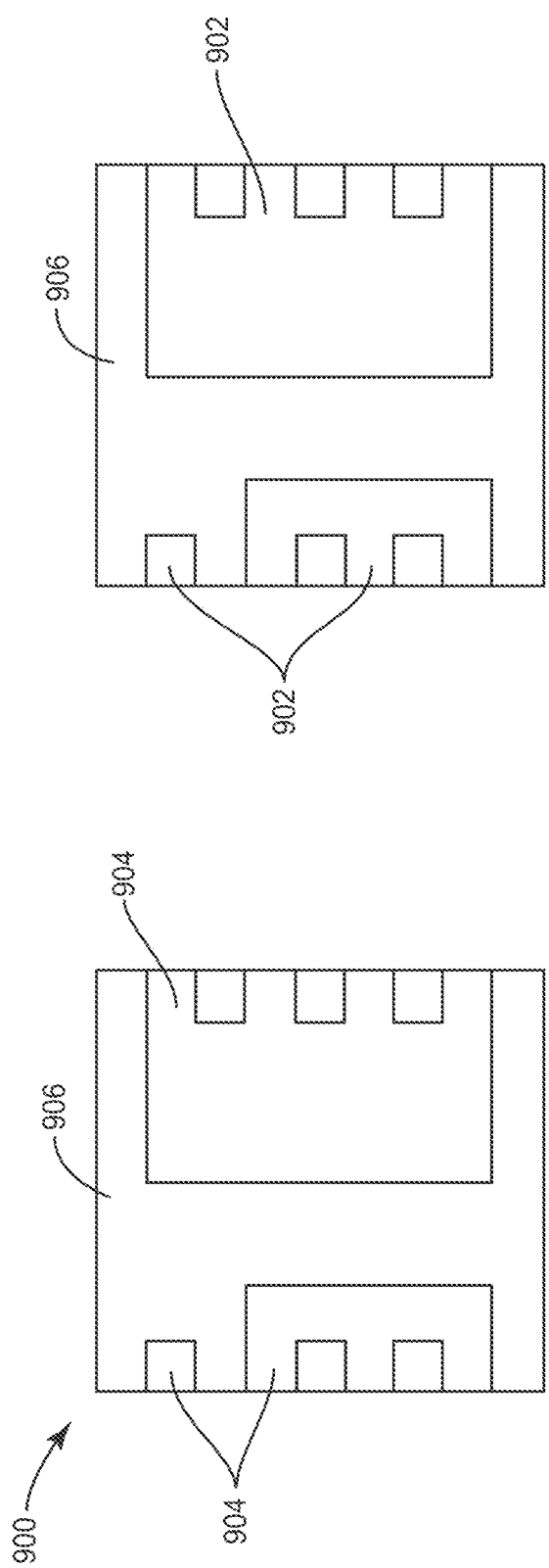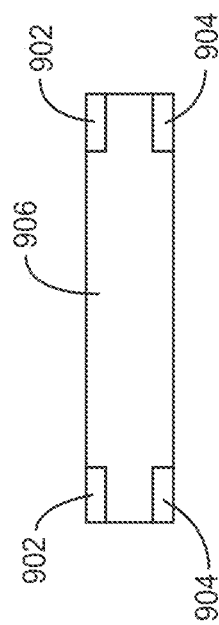
FIG. 15A
FIG. 15B
FIG. 15C

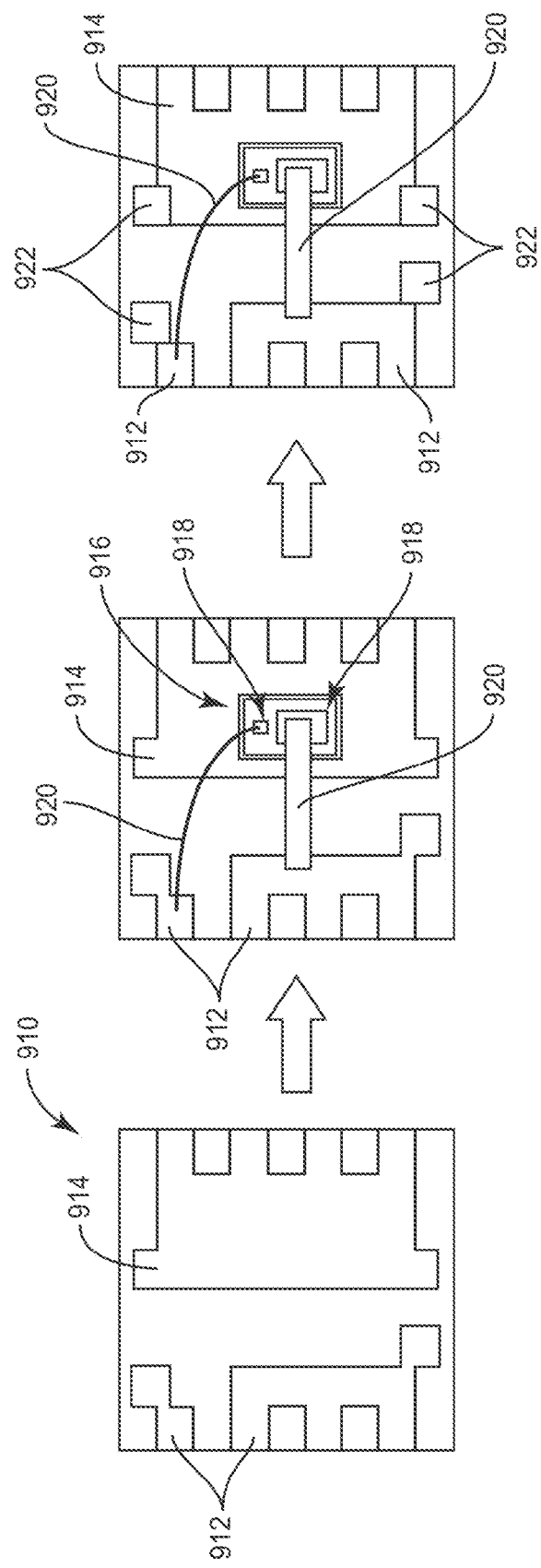

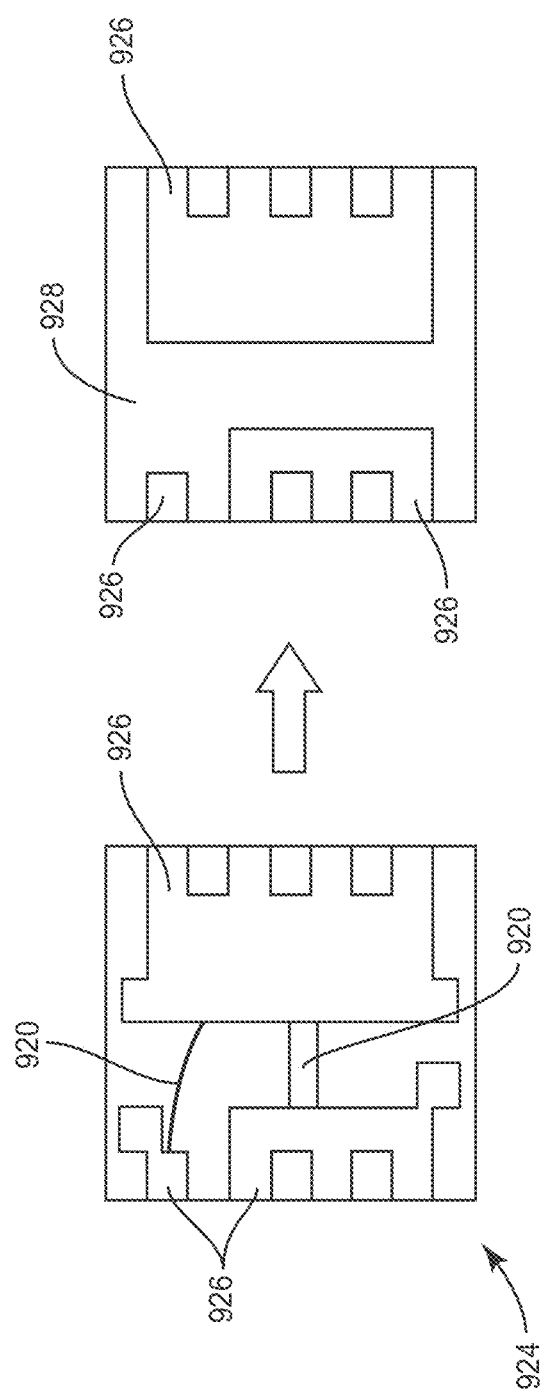

INTERPOSER WITH PROGRAMMABLE MATRIX FOR REALIZING CONFIGURABLE VERTICAL SEMICONDUCTOR PACKAGE ARRANGEMENTS

TECHNICAL FIELD

The present application relates to semiconductor packages, in particular establishing a vertical connection between semiconductor packages.

BACKGROUND

Multiple semiconductor packages (i.e. one or more semiconductor dies encased by metal, plastic, glass, ceramic, etc. to form a single unit) are often required to form a circuit such as a cascode amplifier, a halfbridge power stage, a fullbridge power stage, etc. For example in the case of a cascode amplifier, a JFET (junction field effect transistor) package and a MOSFET (metal oxide semiconductor field effect transistor) package can be used where the gate of the JFET package is connected to the source of the MOSFET package and the source of the JFET package is connected to the drain of the MOSFET package. In the case of a halfbridge power stage, the source of a first (high-side) MOSFET package is connected to the drain of a second (low-side) MOSFET. In the case of a fullbridge power stage, two halfbridge circuits are connected by an inductor. The halfbridge circuits can each be formed as separate packages so that two packages are used, or four separate packages can be used (2 high-side MOSFETs and 2 low-side MOSFETs). In each case, multiple packages are used to form the desired circuit which can also include additional packages such as controller packages, passive packages (capacitors, inductors, etc.), driver packages, etc. It is desirable to attach multiple packages of a circuit to a PCB (printed circuit board) in a cost-effective manner while consuming as little area as possible. Conventional approaches for attaching multiple packages of a circuit to a PCB utilize a fixed footprint and topology.

SUMMARY

According to an embodiment of an interposer for establishing a vertical connection between semiconductor packages, the interposer comprises an electrically insulating substrate having a first main side and a second main side opposite the first main side, a plurality of first electrical conductors at the first main side of the substrate, a plurality of second electrical conductors at the second main side of the substrate, and a programmable connection matrix at one or both main sides of the substrate. The programmable connection matrix comprises programmable junctions configured to open or close electrical connections between different ones of the first electrical conductors and different ones of the second electrical conductors upon programming of the junctions.

According to a hybrid stacked arrangement of semiconductor packages, the hybrid stacked arrangement comprises an interposer, a first semiconductor package and a second semiconductor package. The interposer comprises an electrically insulating substrate having a first main side and a second main side opposite the first main side, a plurality of first electrical conductors at the first main side of the substrate, a plurality of second electrical conductors at the second main side of the substrate, and a programmable connection matrix at one or both main sides of the substrate. The first semiconductor package has terminals attached to at least some of the first electrical conductors at the first main side of the substrate. The second semiconductor package has terminals attached to at least some of the second electrical conductors at the second main side of the substrate. The programmable connection matrix comprises one or more junctions programmed to open or close electrical connections between different ones of the first electrical conductors and different ones of the second electrical conductors so as to electrically connect one or more of the terminals of the first and second semiconductor packages.

A method of establishing a vertical connection between semiconductor packages comprises providing an interposer comprising an electrically insulating substrate having a first main side and a second main side opposite the first main side, a plurality of first electrical conductors at the first main side of the substrate, a plurality of second electrical conductors at the second main side of the substrate, and a programmable connection matrix at one or both main sides of the substrate, the programmable connection matrix comprising programmable junctions configured to open or close electrical connections between different ones of the first electrical conductors and different ones of the second electrical conductors upon programming of the junctions. The method further comprises attaching terminals of a first semiconductor package to at least some of the first electrical conductors at the first main side of the substrate and attaching terminals of a second semiconductor package to at least some of the second electrical conductors at the second main side of the substrate. The method also comprises programming one or more of the junctions of the programmable connection matrix to open or close electrical connections between different ones of the first electrical conductors and different ones of the second electrical conductors so as to electrically connect one or more of the terminals of the first and second semiconductor packages.

Those skilled in the art will recognize additional features and advantages upon reading the following detailed description, and upon viewing the accompanying drawings.

BRIEF DESCRIPTION OF THE FIGURES

The elements of the drawings are not necessarily to scale relative to each other. Like reference numerals designate corresponding similar parts. The features of the various illustrated embodiments can be combined unless they exclude each other. Embodiments are depicted in the drawings and are detailed in the description which follows.

FIG. 2, which includes

FIG. 8, which includes

FIG. 13 illustrates an embodiment of a through-hole package attachment configuration for an interposer with a programmable junction matrix.

FIG. 14 illustrates another embodiment of a through-hole package attachment configuration for an interposer with a programmable junction matrix.

FIG. 15, which includes FIGS. 15A through 15C, illustrates different views of an embodiment of a surface-mount package for attachment to an interposer with a programmable junction matrix.

FIG. 16, which includes FIGS. 16A through 16E, illustrates an embodiment of a method of manufacturing the surface-mount package of FIG. 15.

DETAILED DESCRIPTION

The embodiments described herein provide a flexible footprint and topology for attaching multiple semiconductor packages to a PCB. To this end, an interposer is provided for establishing a vertical connection between two or more semiconductor packages. The interposer includes an electrically insulating substrate with electrical conductors at opposing main sides of the substrate for connecting to semiconductor packages at both sides of the substrate. For example, the interposer can be a PCB in some cases. In general, the interposer includes a programmable connection matrix at one or both sides of the substrate. The programmable connection matrix comprises programmable junctions. One or more of the junctions can be programmed to open or close an electrical connection between different ones of the electrical conductors at both sides of the substrate, so as to electrically connect one or more terminals of the semiconductor packages attached to both sides of the substrate. This way electrical connections between the semiconductor packages attached to the interposer can be customized based on the type of circuit, by programming the corresponding junction(s) of the programmable connection matrix. Depending on the type of programmable junction used, each junction can either open or close an electrical connection between different ones of the electrical conductors at both sides of the substrate upon programming.

Figure 1:
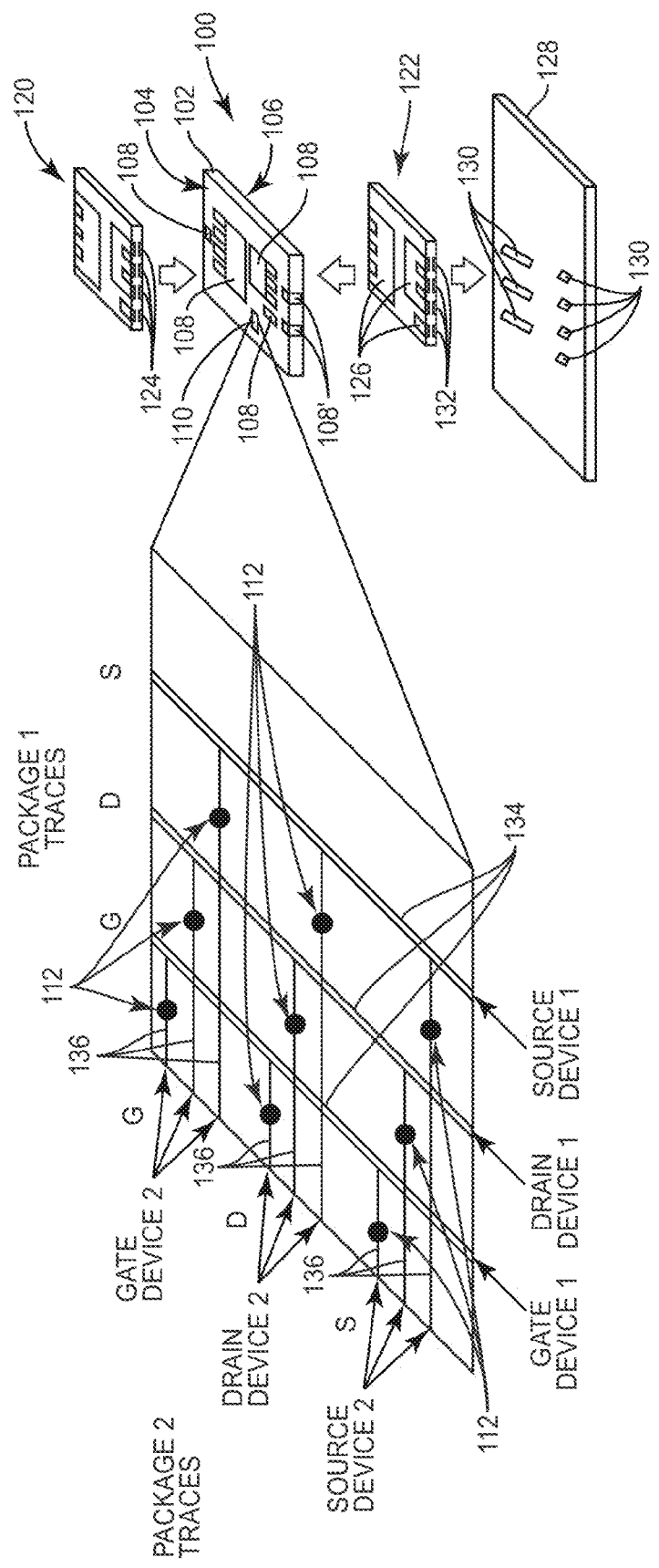
FIG. 1 illustrates an exploded view of an embodiment of an interposer with a programmable junction matrix for establishing a vertical connection between semiconductor packages.

FIG. 1 illustrates an exploded view of an embodiment of an interposer 100 for establishing a vertical connection between two or more semiconductor packages. The interposer 100 comprises an electrically insulating substrate 102 having a first main side 104 and a second main side 106 opposite the first main side 104. In one embodiment, the interposer 100 is a PCB and the electrically insulating substrate 102 is a laminate such as an epoxy-based laminate like FR4 or a resin-based Bismaleimide-Triazine (BT). In another embodiment, the electrically insulating substrate 102 is a ceramic substrate. Still other types of electrically insulating substrates can be used. In each case, a plurality of first electrical conductors 108 are disposed at the first main side 104 of the substrate 102 and a plurality of second electrical conductors (out of view in FIG. 1) are disposed at the second main side 106 of the substrate 102. In the case of a laminate-based interposer e.g. in the case of a PCB, the electrical conductors can be formed from conductive tracks, pads and other features etched from copper sheets laminated onto both sides of the non-conductive substrate 102. Such a laminate substrate can have one or more layers with metal planes or traces that are interconnected to each other by through-hole plated vias, in much the same way as a conventional PCB. In the case of a ceramic-based interposer, the electrical conductors can be formed from patterned metal sheets bonded or brazed to both sides of a ceramic substrate 102 such as a direct copper bonded (DCB) substrate, a direct aluminum bonded (DAB) substrate, an active metal brazed (AMB) substrate, etc. In each case, passives such as resistors, capacitors, inductors and/or diodes can be attached to one or both main sides 104, 106 of the interposer substrate 102. The interposer 100 is not shown with passives in FIG. 1 for ease of illustration.

The interposer 100 further comprises a programmable connection matrix 110 at one or both main sides 104, 106 of the substrate 102. FIG. 1 shows an enlarged view of the programmable connection matrix 110. The programmable connection matrix 110 includes programmable junctions 112 configured to open or close electrical connections between different ones of the electrical conductors 108 at the first main side 104 of the substrate 102 and different ones of the electrical conductors at the second main side 106 of the substrate 102 upon programming of the junctions 112. Whether each programmed junction 112 opens or closes an electrical connection between different ones of the electrical conductors at the opposing sides 104, 106 of the substrate 102 depends on the type of junction used as described in more detail later herein. For each type of programmable junction used, electrical connections between semiconductor packages attached to both sides 104, 106 of the interposer substrate 102 can be customized based on the type of circuit by programming corresponding ones of the junction(s) 112 of the programmable connection matrix 110.

FIG. 1 shows one semiconductor package 120 attached to the top side 104 of the interposer substrate 102 and one semiconductor package 122 attached to the bottom side 106 of the substrate 102. In general, one or more semiconductor packages can be attached to each main side 104, 106 of the interposer substrate depending on the type of circuit being formed. Any type of semiconductor package can be used such as surface-mount packages, through-hole packages, eWLB (embedded wafer level ball grid array) packages, chip carriers, chip scale packages, BGAs (ball grid arrays), PGAs (pin grid arrays), etc. Each semiconductor package has terminals 124, 126 connected to the electrical conductors at the side 104, 106 of the substrate 102 to which the semiconductor package 120, 122 is attached. Any standard package attach process can be employed such as soldering, advanced diffusion soldering, gluing, etc.

Each semiconductor package 122 attached to the bottom side 106 of the interposer substrate 102 is also attached to a PCB 128 in FIG. 1. The PCB 128 includes conductive tracks, pads and other features 130 etched from copper sheets laminated onto a non-conductive substrate. Terminals 132 of the semiconductor package(s) 122 attached to the bottom side 106 of the interposer substrate 102 are connected to these metal structures 130 of the PCB 128 to complete the desired circuit connections. Electrical connections between the semiconductor packages 120, 122 attached to the interposer 100 are determined by which junctions 112 of the programmable connection matrix 110 are programmed and which junctions 112 are not programmed.

FIG. 1 illustrates one example of the programmable connection matrix 110 in which two transistor packages 120, 122 are attached to the interposer 100, each transistor package 122, 124 having a source terminal (S), a drain terminal (D) and a gate terminal (G). The programmable connection matrix 110 includes a conductive trace 134, 136 associated with each terminal of the semiconductor packages 120, 122 attached to the interposer 100. Each conductive trace 134, 136 is connected to one of the electrical conductors 108 of the interposer 100 which in turn is connected to the corresponding terminal of the semiconductor package 120, 122 associated with that trace 134, 136. In FIG. 1, a first group of traces 134 is associated with the terminals 124 of the semiconductor package 120 attached to the top side 104 of the interposer substrate 100 and a second group of traces 136 is associated with the terminal 126 of the semiconductor package 122 attached to the bottom side 104 of the interposer substrate 100.

In the case of a laminate-based interposer, the connections between the traces 134, 136 and the corresponding electrical conductors 108 of the interposer 100 can be formed as part of conductive tracks, pads and other features etched into copper sheets laminated onto the non-conductive substrate 102. In the case of a multi-layer laminate substrate, these connections can span multiple levels and be enabled by through-hole plated vias. In the case of a ceramic-based interposer, the connections between the traces 134, 136 and the corresponding electrical conductors 108 of the interposer 100 can be formed by appropriately patterning metal sheets bonded or brazed to a ceramic substrate 102. The traces 134, 136 associated with the different packages 120, 122 are shown as a grid in FIG. 1, but can have any configuration or arrangement.

Regardless of the type of interposer and configuration of the programmable connection matrix traces 134, 136, the traces 134, 136 are insulated from one another. Also, a programmable junction 112 is provided between each conductive trace 134 electrically connected to a terminal 124 of the first semiconductor package 120 and each conductive trace 136 electrically connected to a terminal 126 of the second semiconductor package 122. Each programmable junction 112 is configured to open or close a corresponding electrical connection between one of the first electrical conductors 108 at the first side 104 of the interposer substrate 102 and one of the second electrical conductors (out of view in FIG. 1) at the second side 106 of the interposer substrate 102 upon programming of that junction 112. This way, the terminals 124, 126 of the semiconductor packages 120, 122 can be electrically connected in any desired configuration by programming the corresponding junction(s) 112 of the programmable connection matrix 110.

Figure 2C:
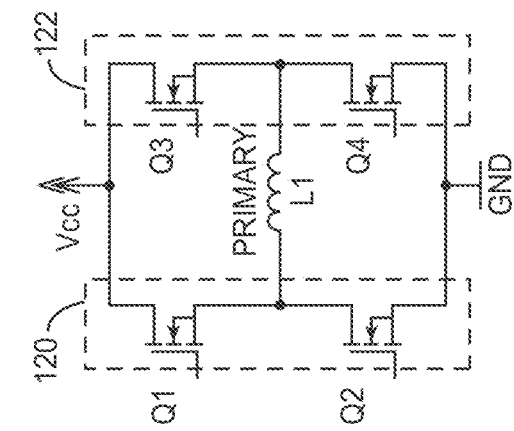
FIGS. 2A through 2C, illustrates different exemplary circuits which can be realized using the interposer of FIG. 1.
Figure 2B:
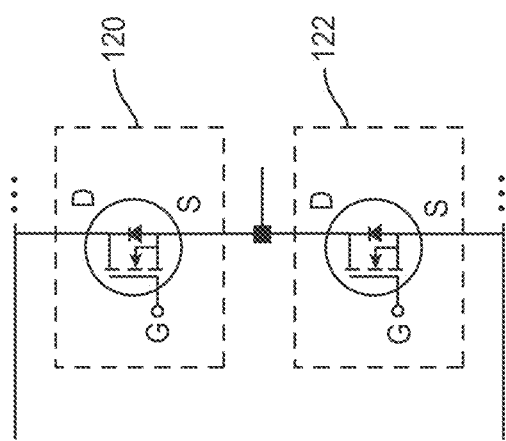
Figure 2A:
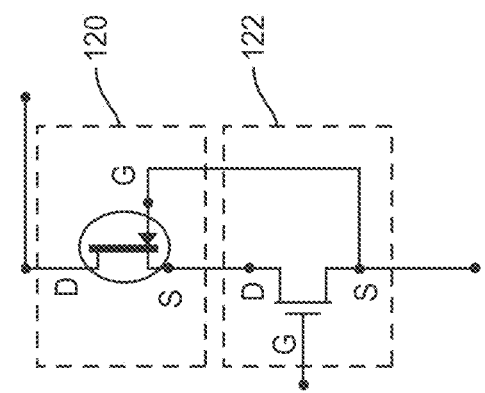

FIG. 2, which includes FIGS. 2A through 2C, illustrates different examples of package connections that can be realized for the packages 120, 122 attached to the interposer 100 shown in FIG. 1.

FIG. 2A shows a cascade circuit where the first semiconductor package 120 includes a normally-on JFET device and the second semiconductor package 122 includes a normally-off MOSFET device. The package 120 with the normally-on JFET is attached to a first main side 104 of the interposer substrate 102 and has a gate terminal (G) attached to a first electrical conductor 108 at the first side 104 of the substrate 102, a drain terminal (D) attached to a second electrical conductor 108 at the first side 104 of the substrate 102 and a source terminal (S) attached to a third electrical conductor 108 at the first side 104 of the substrate 102. The package 122 with the normally-off MOSFET is attached to the opposing second main side 106 of the interposer substrate 102 and has a gate terminal (G) attached to a first electrical conductor (out of view in FIG. 1) at the second main side 106 of the substrate 102, a drain terminal (D) attached to a second electrical conductor (out of view in FIG. 1) at the second side 106 of the substrate 102 and a source terminal (S) attached to a third electrical conductor (out of view in FIG. 1) at the second side 106 of the substrate 102. A first one of the junctions 112 of the programmable connection matrix 110 is programmed to complete an electrical connection between the first electrical conductor at the first side 104 of the interposer substrate 102 and the third electrical conductor at the second side 106 of the interposer substrate 102 so as to electrically connect the gate terminal of the normally-on JFET to the source terminal of the normally-off MOSFET as schematically shown in FIG. 2A. A second one of the junctions 112 is programmed to complete an electrical connection between the third electrical conductor at the first side 104 of the interposer substrate 102 and the second electrical conductor at the second side 106 of the interposer substrate 102 so as to electrically connect the source terminal of the normally-on JFET to the drain terminal of the normally-off MOSFET also as schematically shown in FIG. 2A.

FIG. 2B shows a halfbridge circuit where the first semiconductor package 120 includes a high-side MOSFET and the second semiconductor package 122 includes a low-side MOSFET. The package 120 with the high-side MOSFET is attached to a first main side 104 of the interposer substrate 102 and has a gate terminal (G) attached to a first electrical conductor 108 at the first side 104 of the interposer substrate 102, a drain terminal (D) attached to a second electrical conductor 108 at the first side 104 of the interposer substrate 102 and a source terminal (S) attached to a third electrical conductor 108 at the first side 104 of the interposer substrate 102. The package 122 with the low-side MOSFET is attached to the opposing second main side 106 of the interposer substrate 102 and has a gate terminal (G) attached to a first electrical conductor (out of view in FIG. 1) at the second side 106 of the interposer substrate 102, a drain terminal (D) attached to a second electrical conductor (out of view in FIG. 1) at the second side 106 of the interposer substrate 102 and a source terminal (S) attached to a third electrical conductor (out of view in FIG. 1) at the second side 106 of the interposer substrate 102. One of the programmed junctions 112 of the programmable connection matrix 110 completes an electrical connection between the third electrical conductor at the first side 104 of the interposer substrate 102 and the second electrical conductor at the second side 106 of the interposer substrate 102 so as to electrically connect the source terminal of the first normally-off MOSFET to the drain terminal of the second normally-off MOSFET as schematically shown in FIG. 2B.

FIG. 2C shows a fullbridge circuit where the first semiconductor package 120 includes a first halfbridge and the second semiconductor package 122 includes a second halfbridge. The halfbridge outputs are connected by an inductor (L1). The package 120 with the first halfbridge is attached to a first main side 104 of the interposer substrate 102 and has a first pair of normally-off MOSFETs (Q1, Q2) connected in a half-bridge configuration with a power terminal (Vcc) attached to a first electrical conductor 108 at the first side 104 of the interposer substrate 102 and a ground terminal (GND) attached to a second electrical conductor 108 at the first side 104 of the interposer substrate 102. The package 122 with the second halfbridge is attached to the opposing second side 106 of the interposer substrate 102 and has a second pair of normally-off MOSFETs (Q3, Q4) connected in a half-bridge configuration with a power terminal (Vcc) attached to a first electrical conductor (out of view in FIG. 1) at the second side 106 of the interposer substrate 102 and a ground terminal (GND) attached to a second electrical conductor (out of view in FIG. 1) at the second side 106 of the interposer substrate 104. A first one of the junctions 112 of the programmable connection matrix 110 can be programmed to complete an electrical connection between the first electrical conductor at the first side 104 of the interposer substrate 102 and the first electrical conductor at the second side 106 of the interposer substrate 102 so as to electrically connect the power terminals (Vcc) of the first and second halfbridges as schematically shown in FIG. 2C. A second one of the junctions 112 can be programmed to complete an electrical connection between the second electrical conductor at the first side 104 of the interposer substrate 102 and the second electrical conductor at the second side 106 of the interposer substrate 102 so as to electrically connect the ground terminals (GND) of the first and second halfbridges also as schematically shown in FIG. 2C. Yet other circuit configurations can be realized using the interposer 100 with programmable connection matrix 110 described herein.

Figure 3:
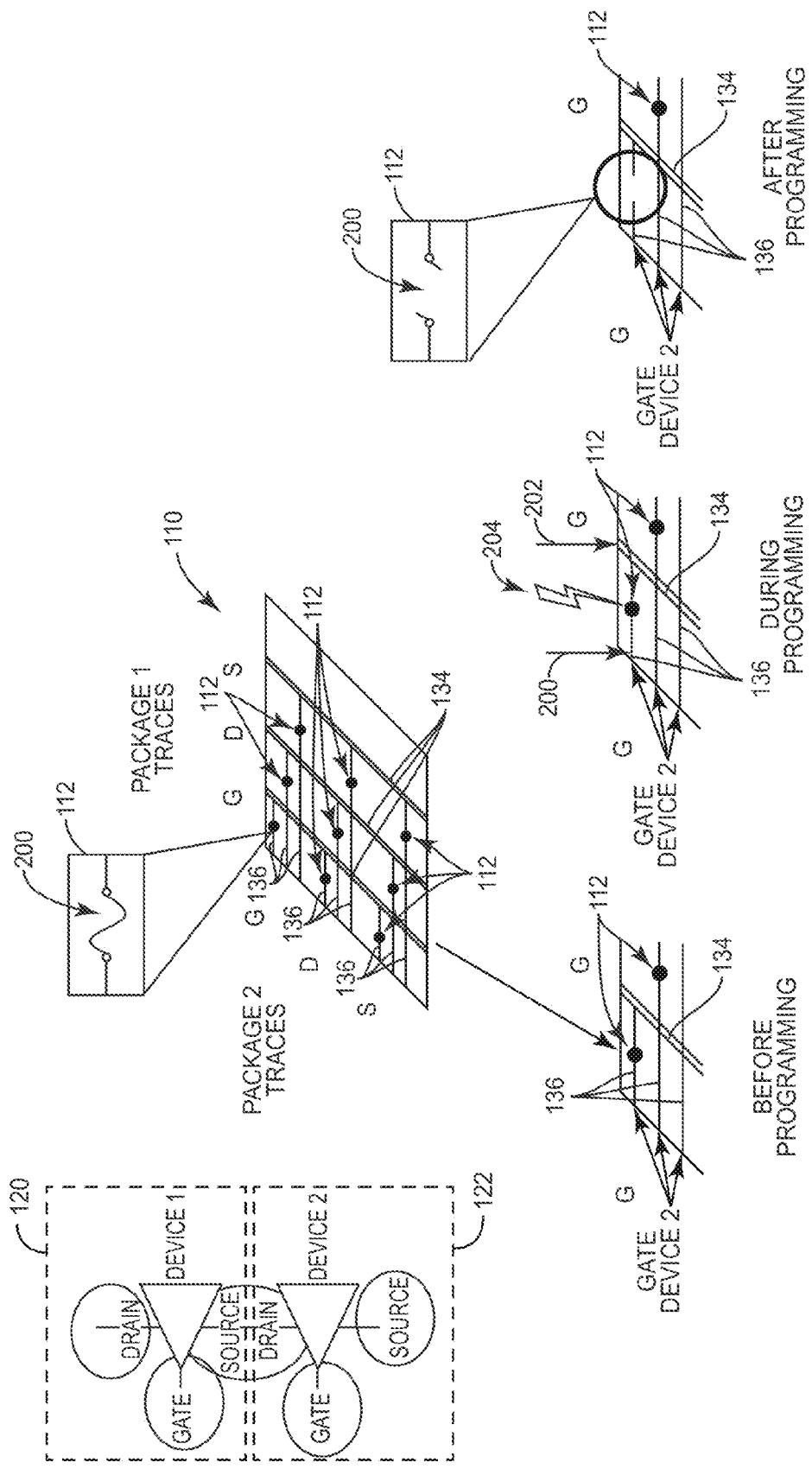
FIGS. 3 and 4 illustrate an embodiment of the programmable junction matrix of the interposer before, during and after programming to realize an exemplary circuit configuration.

FIG. 3 illustrates an embodiment of programming one or more junctions 112 of the programmable connection matrix 110. For purely illustrative purposes, the junction programming embodiment is described next in the context of a halfbridge circuit in which a first semiconductor package attached 120 to one side 104 of the interposer substrate 102 includes a high-side MOSFET and a second semiconductor package 122 attached to the opposing side 106 of the interposer substrate 102 includes a low-side MOSFET. The source of the high-side MOSFET is electrically to the drain of the low-side MOSFET to form the halfbridge circuit as schematically shown in FIG. 3 and previously described herein in connection with FIG. 2B. This electrical connection is formed by programming the corresponding junction 112 of the programmable connection matrix 110 so that only the electrical connection between the source of the high-side MOSFET and the drain of the low-side MOSFET remains after the junction programming process. According to this embodiment, each programmable junction 112 is a fuse 200 such as a surface mount fuse attached to the interposer substrate 102 or a fuse integrated into the traces 134, 136 of the programmable connection matrix 110 e.g. by narrowing the cross-sectional area of the traces 134, 136 to form a low current density region. Still other types of fuses can be used as the programmable junctions 112.

In each case, electrical connections between the semiconductor packages 120, 122 are opened by programming the corresponding fuses 200. Fuse programming depends on the type of fuse used. For example, a fuse can be programmed by contacting the two corresponding traces 134, 136 of the programmable connection matrix 110 with probes 200, 202 and directing a programming current through the probes 200, 202 until the fuse 200 opens. Other types of fuses can be programmed by directing a laser beam or other energy source 204 at the fuse 200 to open the fuse 200. Still other types of fuse programming techniques can be employed. In each case, the programmed fuses 200 open the respective electrical connections to disconnect the corresponding terminals of the semiconductor packages 120, 122. A particular electrical connection remains intact by not programming the corresponding fuse 200. FIG. 3 shows an enlarged view of part of the programmable connection matrix 110 before, during and after programming. The enlarged region of the programmable connection matrix 110 shown in FIG. 3 corresponds to a fuse 200 that electrically connects the gate terminal (G) of the first semiconductor package 120 to the gate terminal (G) of the second semiconductor package 122. Since these terminals should not be connected to form a halfbridge as indicated by the circuit schematic shown in FIG. 3, this fuse 200 is programmed to open this electrical connection.

Figure 4:
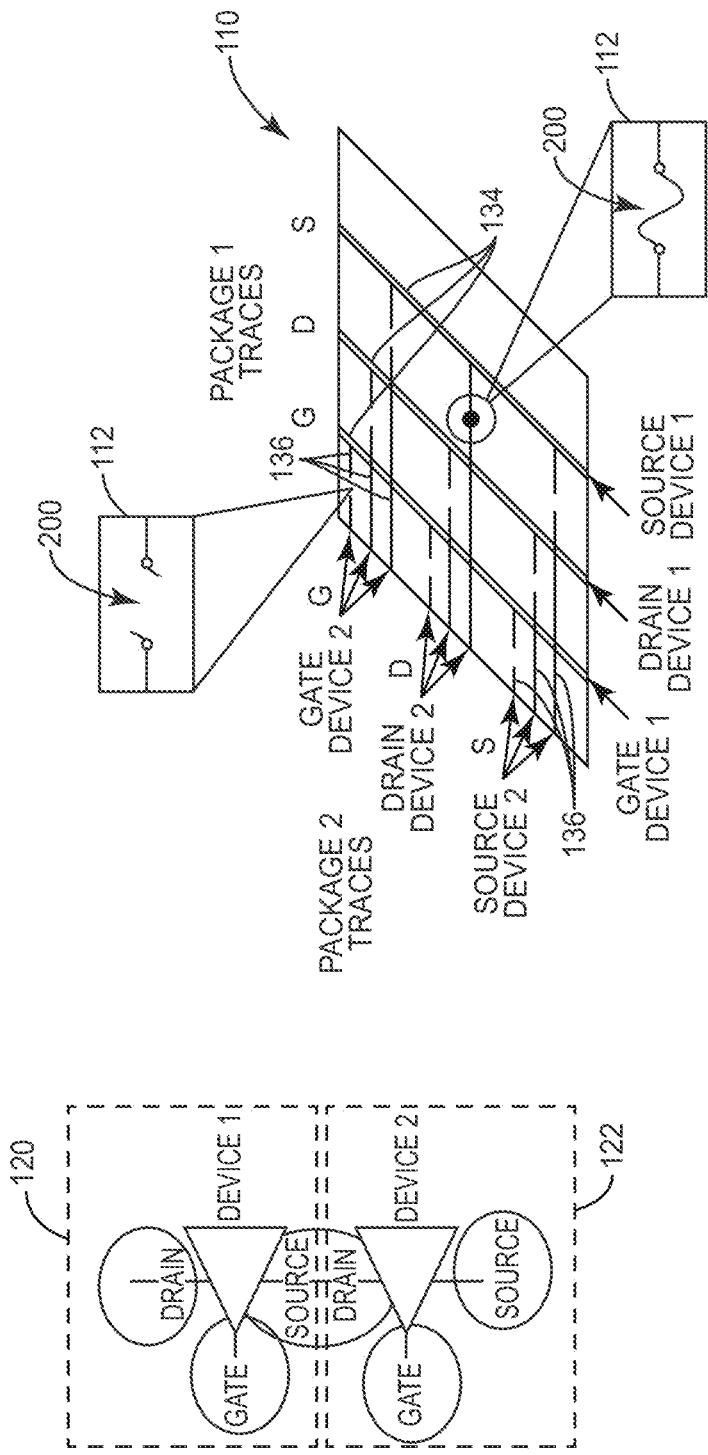

FIG. 4 shows the programmable connection matrix 110 after completion of the junction programming process. As indicated by the circuit schematic shown in FIG. 4, only the source terminal (S) of the high-side MOSFET package 120 is electrically connected to the drain terminal (D) of the low-side MOSFET package 122 to form the halfbridge circuit. By using fuses 200 as the programmable junctions 112, this means that all fuses 200 are opened (200') except for the fuse 200 that electrically connects the source terminal of the high-side MOSFET package 120 and the drain terminal of the low-side MOSFET package 122 through the corresponding conductors on the opposing sides 104, 106 of the interposer substrate 102.

Figure 5:
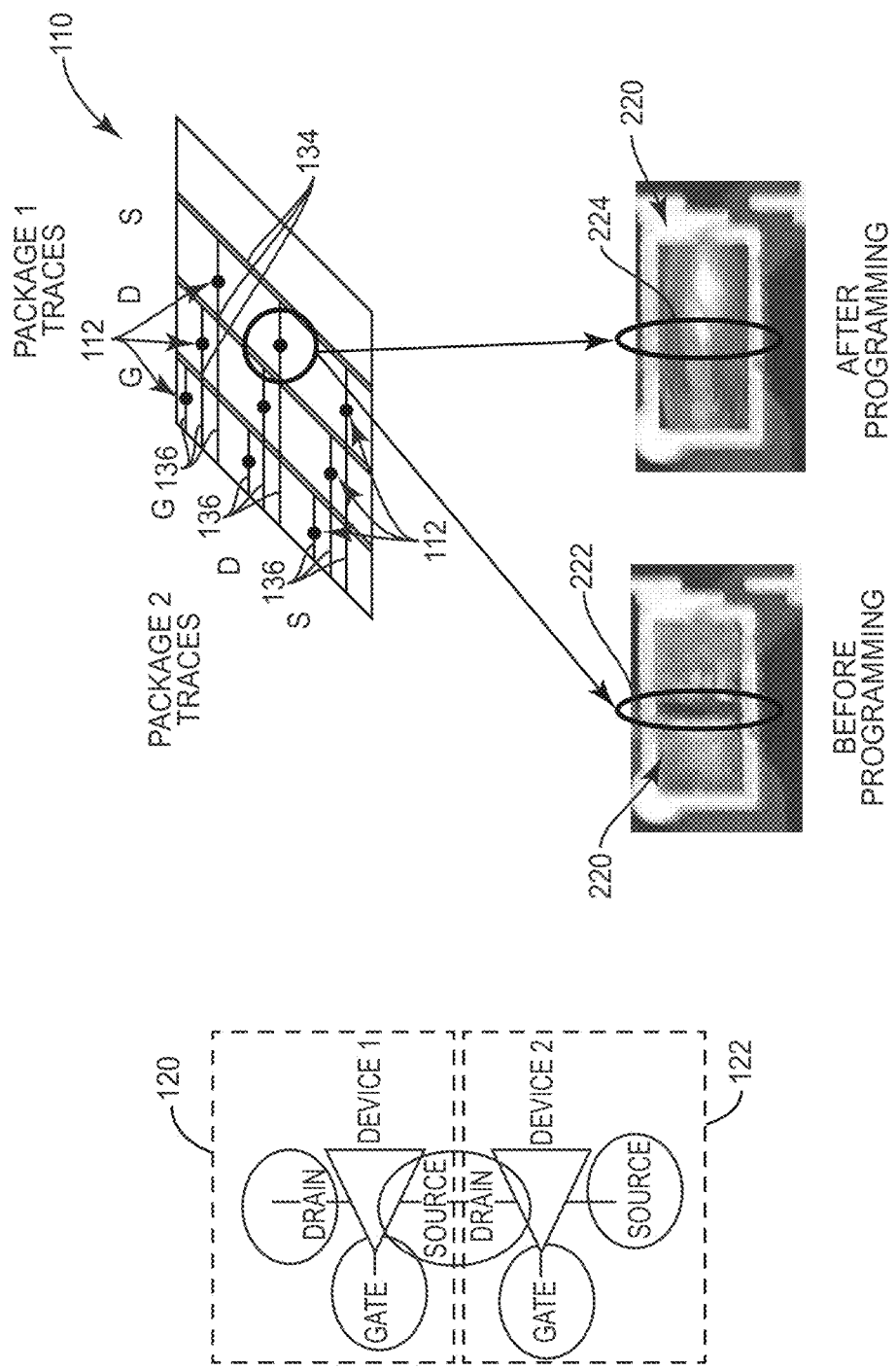
FIG. 5 illustrates another embodiment of the programmable junction matrix of the interposer before and after programming to realize an exemplary circuit configuration.

FIG. 5 illustrates another embodiment of programming one or more junctions 112 of the programmable connection matrix 110. Again for purely illustrative purposes, the junction programming embodiment is described next in the context of a halfbridge circuit in which a first semiconductor package 120 attached to one side 104 of the interposer substrate 102 includes a high-side MOSFET and a second semiconductor package 122 attached to the opposing side 106 of the interposer substrate 102 includes a low-side MOSFET. The source (S) of the high-side MOSFET must be electrically to the drain (D) of the low-side MOSFET to form the halfbridge circuit as schematically shown in FIG. 5. This electrical connection is formed by programming the corresponding junction 112 of the programmable connection matrix 110 so that only the electrical connection between the source of the high-side MOSFET and the drain of the low-side MOSFET remains after the junction programming. According to this embodiment, each programmable junction 112 comprises an open solder bridge 220 which can be closed (shunted) by solder so as to close the electrical connection between the corresponding electrical conductors on the opposing sides 104, 106 of the interposer substrate 102. A particular electrical connection is formed by closing the gap 222 in the corresponding solder bridge 220. FIG. 5 shows an enlarged view of part of the programmable connection matrix 110 before and after programming. The enlarged region of the programmable connection matrix 110 shown in FIG. 5 corresponds to the solder bridge 220 that electrically connects the source terminal of the first semiconductor package 120 to the drain terminal of the second semiconductor package 122. The gap 222 of this solder bridge 220 is filled with solder 224 during the junction programming process, and all other solder bridges 220 remain opened (disconnected) to form the halfbridge circuit shown in FIG. 5.

Figure 6:
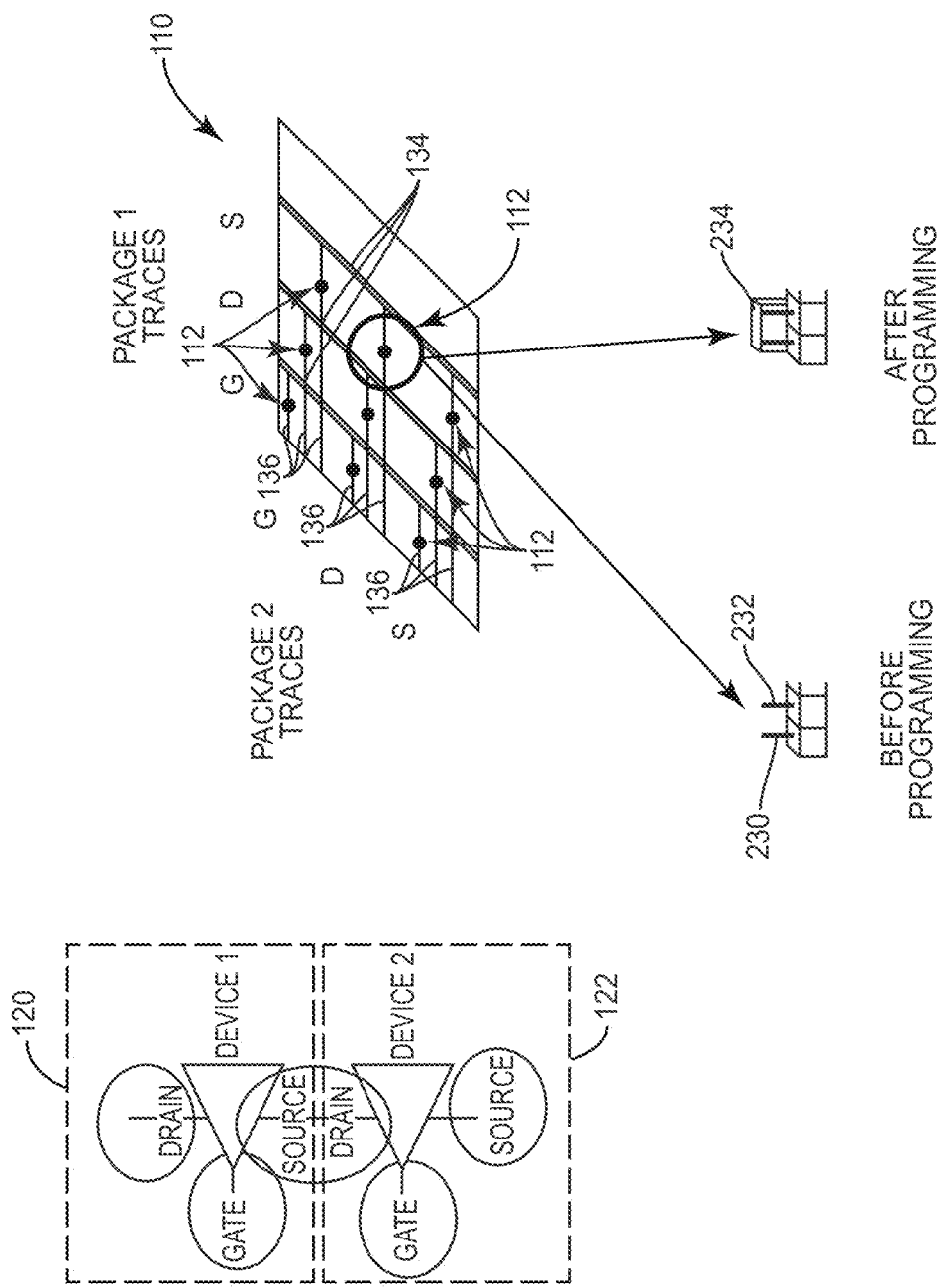
FIG. 6 illustrates yet another embodiment of the programmable junction matrix of the interposer before and after programming to realize an exemplary circuit configuration.

FIG. 6 illustrates yet another embodiment of programming one or more junctions 112 of the programmable connection matrix 110. Again for purely illustrative purposes, the junction programming embodiment is described next in the context of a halfbridge circuit in which a first semiconductor package 120 attached to one side 104 of the interposer substrate 102 includes a high-side MOSFET and a second semiconductor package 122 attached to the opposing side 106 of the interposer substrate 102 includes a low-side MOSFET. The source (S) of the high-side MOSFET must be electrically connected to the drain (D) of the low-side MOSFET to form the halfbridge circuit as schematically shown in FIG. 6. This electrical connection is formed by programming the corresponding junction 112 of the programmable connection matrix 110 so that only the electrical connection between the source of the high-side MOSFET and the drain of the low-side MOSFET remains intact after the junction programming. According to this embodiment, each programmable junction 112 comprises a pair of jumper terminals 230, 232 which can be connected by a jumper shunt to close the electrical connection between the corresponding electrical conductors on the opposing sides 104, 106 of the interposer substrate 102. FIG. 6 shows an enlarged view of part of the programmable connection matrix 110 before and after programming. The enlarged region of the programmable connection matrix 110 shown in FIG. 6 corresponds to the pair of jumper terminals 230, 232 that electrically connects the source terminal of the first semiconductor package 120 to the drain terminal of the second semiconductor package 122. This pair of jumper terminals 230, 232 is shunted by a jumper 234 during the junction programming process, and all other pairs of jumper terminals 230, 232 remain opened (disconnected) to form the halfbridge circuit in FIG. 6.

Figure 7:
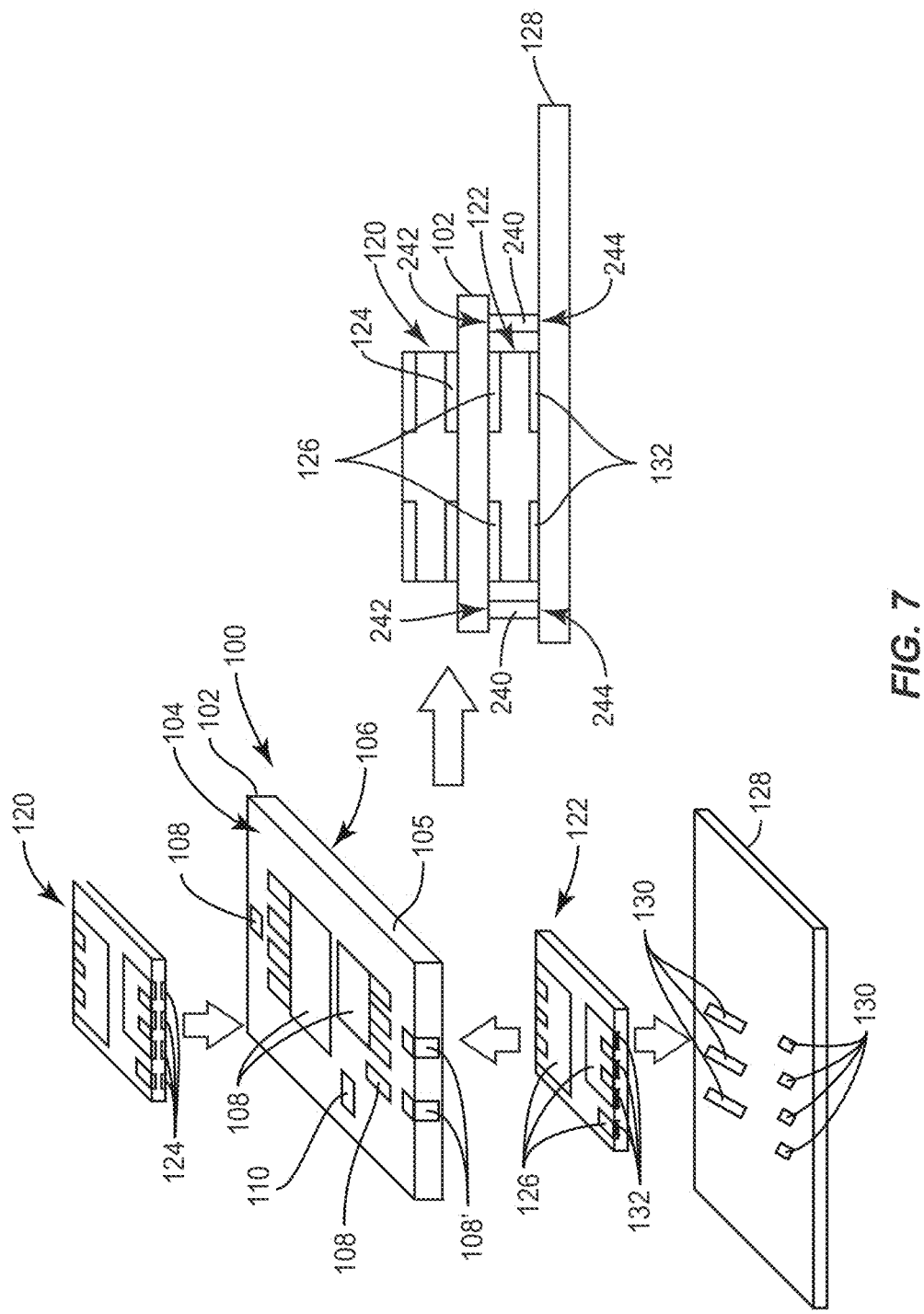
FIG. 7 illustrates exploded and assembled views of an embodiment of an interposer with a programmable junction matrix for establishing a vertical connection between semiconductor packages.

FIG. 7 illustrates exploded and assembled views of another embodiment of the interposer 100 with a first semiconductor package 120 having terminals 124 attached to at least some of the electrical conductors 108 at the first main side 104 of the interposer substrate 102 and a second semiconductor package 122 having terminals 126 attached to at least some of the electrical conductors (out of view in FIG. 7) at the second main side 106 of the interposer substrate 102. The programmable connection matrix 110 comprises one or more junctions 112 programmed to open or close electrical connections between different ones of the electrical conductors at the opposing sides 104, 106 of the interposer substrate 102 so as to electrically connect one or more of the terminals 124, 126 of the first and second semiconductor packages 120, 122, as previously described herein. A PCB 128 is also provided to which the second semiconductor package 122 is attached at a side of the second semiconductor package 122 facing away from the interposer 100. The PCB 128 has a patterned metallization 130 connected to terminals 132 at the side of the second semiconductor package 122 attached to the PCB 128. The patterned metallization 130 can include conductive tracks, pads and other features etched from copper sheets laminated onto one or both sides of a non-conductive substrate.

Further according to this embodiment, some of the electrical conductors 108' at the first side 104 of the interposer substrate 102 extend from the first side 104 of the substrate 102 to an edge 105 of the substrate 102 between the first and second sides 104, 106 and onto the second side 106 of the interposer substrate 102. These conductors 108' provide additional points of electrical connection for the first semiconductor package 120 at the second side 106 of the interposer substrate 102. This way, one or more electrical connections can be made from the first semiconductor package 120 to the second semiconductor package 122 through the programmable connection matrix 110. Additional connections can be made to the first semiconductor package 120 by the electrical conductors 108' that extend from the first side 104 of the interposer substrate 102 to the edge 105 of the substrate 102 and onto the second side 106 of the substrate 102. Additional electrical conductors 240 such as bins, posts, columns, solder balls, etc. can be provided which extend outward from the second main side 106 of the interposer substrate 102, with a first end 242 of these additional electrical conductors 240 being attached at the second main side 106 of the substrate 102 and connected to the electrical conductors 108' that extend from the first main side 104 of the interposer substrate 102 onto the second main side 106 of the substrate 102. The opposing second end 244 of the additional electrical conductors 108' can be connected to the patterned metallization 130 of the PCB 128 to facilitate additional electrical connections to the semiconductor package 120 attached to the side 104 of the interposer substrate 102 facing away from the PCB 128.

Figure 8A:
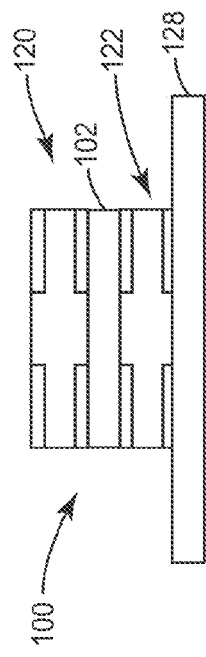
FIGS. 8A through 8C, illustrates different configurations of an interposer with a programmable junction matrix for establishing a vertical connection between semiconductor packages.
Figure 8B:
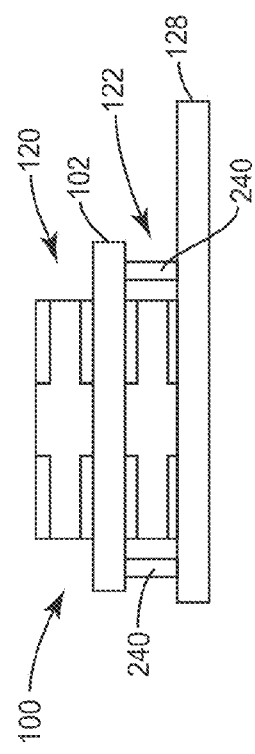
Figure 8C:
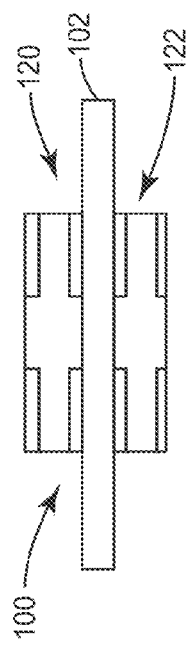

FIG. 8, which includes FIGS. 8A through 8C, illustrates additional embodiments of the interposer 100 with a first semiconductor package 120 having terminals 124 attached to at least some of the electrical conductors (out of view in FIG. 8) at the first main side 104 of the interposer substrate 102 and a second semiconductor package 122 having terminals 126 attached to at least some of the electrical conductors (out of view in FIG. 8) at the second main side 106 of the interposer substrate 102.

In the embodiment of FIG. 8A, all of the electrical connections for the first semiconductor package 120 are made through the interposer 100 to the second semiconductor package 122 which is attached to a PCB 128.

In the embodiment of FIG. 8B, one or more of the electrical connections for the first semiconductor package 120 are made through the interposer 100 to the second semiconductor package 122 which is attached to a PCB 128. Additional electrical conductors 240 such as bins, posts, columns, solder balls, etc. extend outward from the second main side 106 of the interposer substrate 102, with a first end 242 of these additional electrical conductors 240 being attached to the second main side 106 of the substrate 102 and connected to electrical conductors 108' that extend from the first main side 104 of the interposer substrate 102 onto the second main side 106 of the substrate 102. The opposing second end 244 of the additional electrical conductors 240 is connected to the patterned metallization (out of view in FIG. 8) of the PCB 128 to facilitate additional electrical connections to the semiconductor package 120 attached to the side 104 of the interposer substrate 102 facing away from the PCB 128 e.g. as previously described herein in connection with FIG. 7.

In the embodiment of FIG. 8C, the electrically insulating substrate 102 of the interposer 100 is the final PCB to which the semiconductor packages 120, 122 are attached. According to this embodiment, all electrical connections between the semiconductor packages 120, 122 attached to the opposing main sides 104, 106 of the PCB 102 are realized through the PCB 102 and the programmable connection matrix 110 which is provided at either or both sides 104, 106 of the PCB 102.

Figure 9:
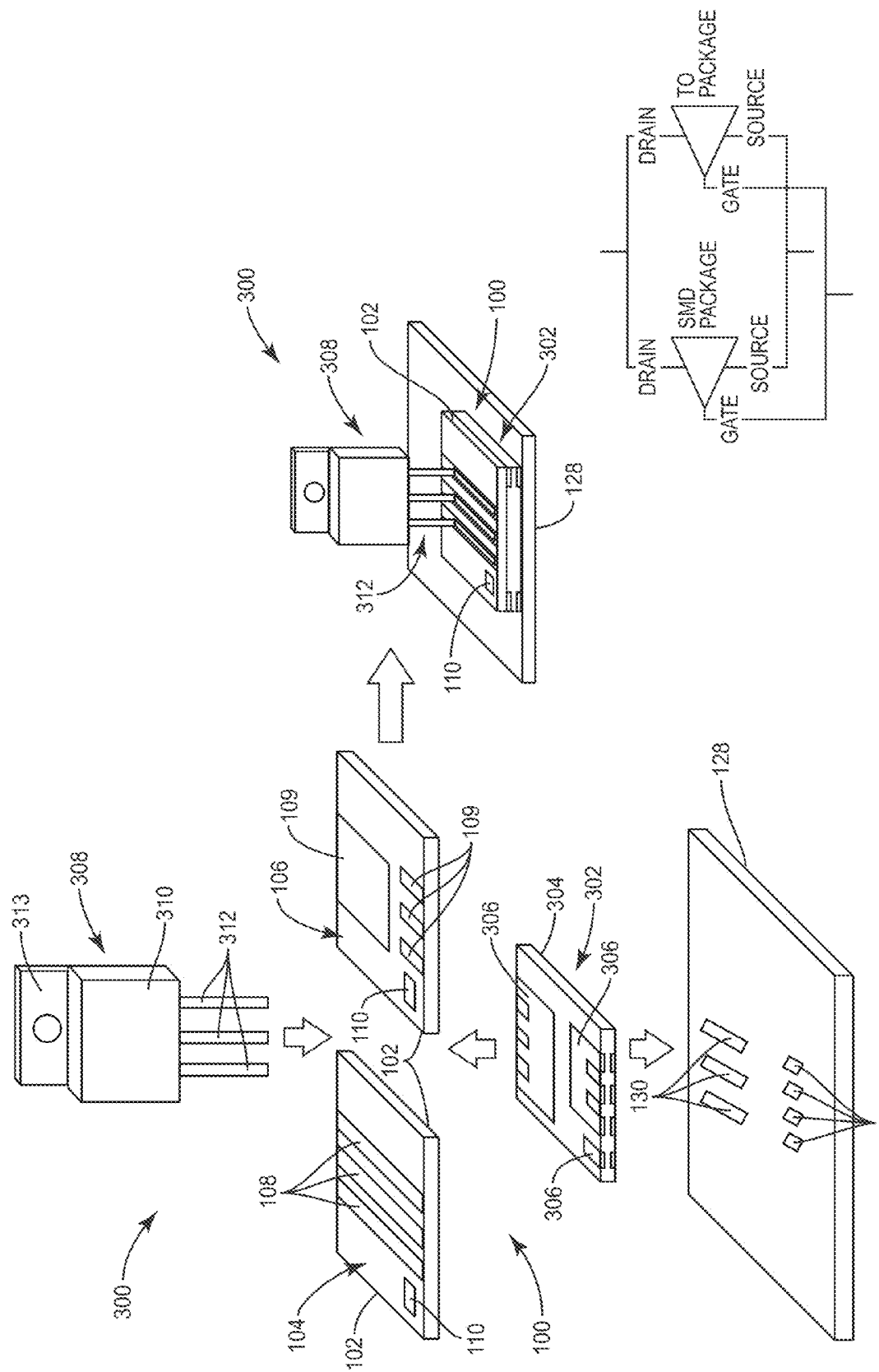
FIG. 9 illustrates exploded and assembled views of an embodiment of an interposer with a programmable junction matrix for establishing a vertical connection between semiconductor packages.

FIG. 9 illustrates exploded and assembled views of an embodiment of a hybrid stacked arrangement 300 of semiconductor packages using the interposer 100. According to this embodiment, a first semiconductor package 302 attached to the bottom side 106 of the interposer substrate 102 is a surface-mount package comprising one or more semiconductor dies (out of view in FIG. 9) encased in a molding compound 304 and exposed leads 306 embedded in the molding compound 304 and electrically connected to the one or more semiconductor dies. A surface-mount package typically has gullwing or other type of leads or other pad formations and a heat slug (not shown) or exposed die pads which can be mounted on one side to the interposer substrate 102 and on the opposite to a PCB 128. At least some of the exposed leads 306 form terminals of the surface-mount package 302.

A second semiconductor package 308 attached to the top side 104 of the interposer substrate 102 is a through-hole package comprising one or more semiconductor dies (out of view in FIG. 9) encased in a molding compound 310 and pins 312 extending out of the molding compound 310 and electrically connected to the one or more semiconductor dies. The pins 312 form terminals of the through-hole semiconductor package 308. Through-hole packages typically have pins (leads) that are straight at the end and longer than the leads of a surface-mount package, so that the pins can be inserted into holes in a PCB and attached by wave soldering, for example. An extra heatsink 313 can either be mounted on a heat slug or exposed die pad, or PCB pads can be used to dissipate the emerging heat. In the embodiment of FIG. 9, the pins 312 of the through-hole package 308 can be bent coplanar with the interposer substrate 102 and soldered to respective ones of the electrical conductors 108 at the top side 104 of the interposer substrate 102.

The top and bottom sides 104, 106 of the interposer substrate 102 and the respective electrical conductors 108, 109 at the top and bottom sides 104, 106 of the substrate 102 are shown in FIG. 9 to illustrate that the conductor footprint of the opposing main sides 104, 106 of the interposer substrate 102 can depend on the terminal footprint of the packages 302, 304 attached to the substrate 102. The programmable connection matrix 110 can be provided at one or both sides 104, 106 of the interposer substrate 102.

The surface-mount package 302 is attached to the interposer substrate 102 at one side and to a PCB 128 at the opposite side. The programmable connection matrix 110 provides one or more electrical connections between the surface-mount package 302 attached to the bottom side 106 of the interposer substrate 102 and the through-hole package 308 attached to the top side 104 of the interposer substrate 102. Further according to the embodiment of FIG. 9, the gate terminals, drain terminals and source terminals of the two different packages 302, 308 are electrically connected, respectively, as shown in the circuit schematic of FIG. 9. The programmable connection matrix 110 enables these terminal connections by programming the corresponding junctions 112 of the programmable connection matrix 110 as previously described herein. Because each terminal of the through-hole package 308 is electrically connected to the corresponding terminal of the surface-mount package 302, each pin 312 of the through-hole package 302 is connected to one of the electrical conductors 108 at the top side 104 of the interposer substrate 102.

Figure 10:
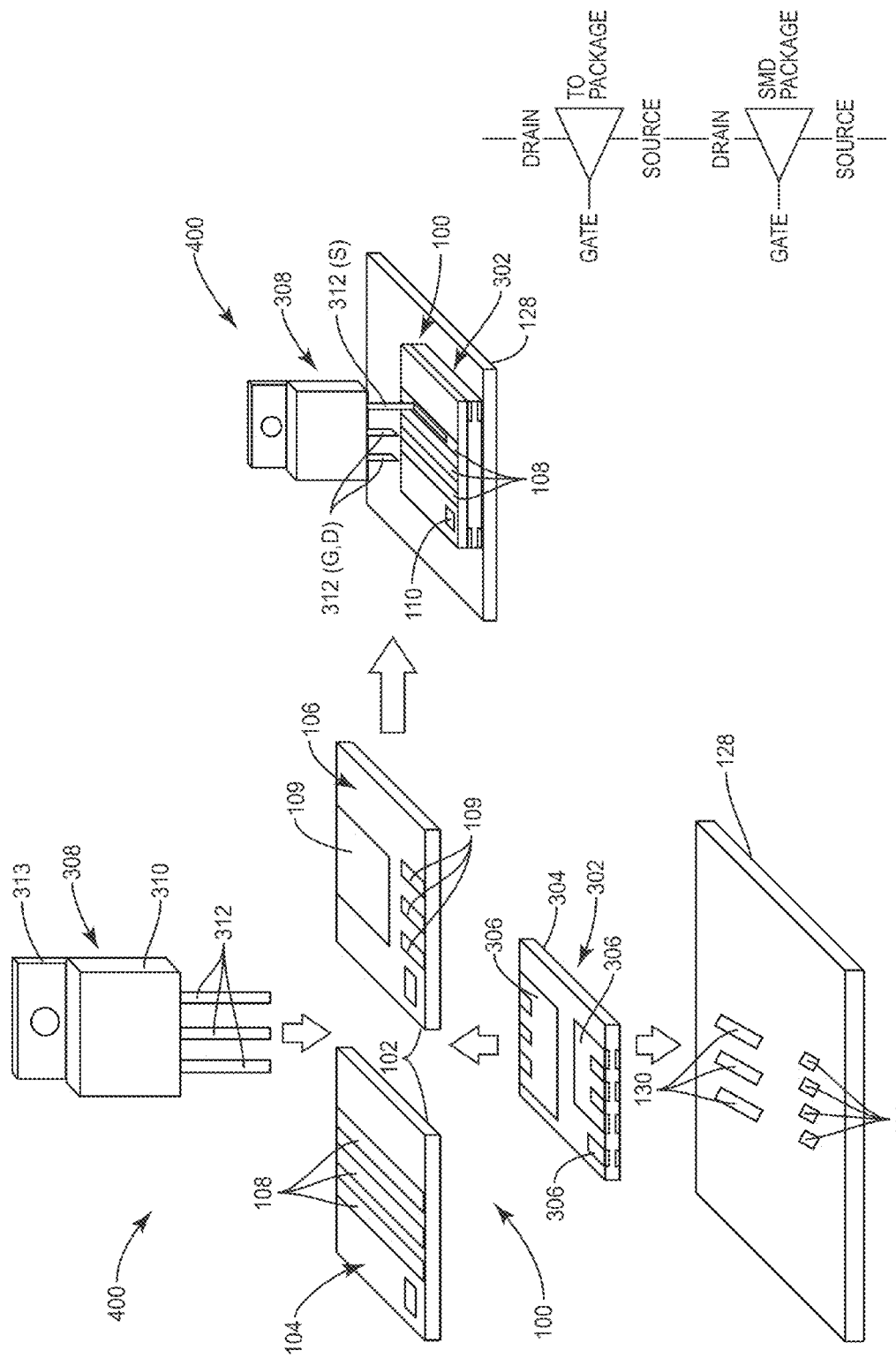
FIG. 10 illustrates exploded and assembled views of another embodiment of an interposer with a programmable junction matrix for establishing a vertical connection between semiconductor packages.

FIG. 10 illustrates exploded and assembled views of another embodiment of a hybrid stacked arrangement 400 of semiconductor packages using the interposer 100. The embodiment shown in FIG. 10 is similar to the embodiment shown in FIG. 9, however, only the source terminal of the through-hole package 308 is electrically connected to the drain terminal of the surface-mount package 302 as shown in the circuit schematic of FIG. 10. Accordingly, the pin 312 that forms the gate terminal of the through-hole package 308 and the pin 312 that forms the drain terminal of the through-hole package 308 remain unconnected to any of the electrical conductors 108 at the top side 104 of the interposer substrate 102. Instead, these pins 312 are connected directly to the PCB 128. For example, the gate and drain pins 312 of the through-hole package 308 can be bent in a plane parallel to the substrate interposer 102 beyond the edge 105 of the substrate 102 and then bent downward towards the PCB 128. This configuration of the gate and drain pins 312 of the through-hole package 308 is not shown in FIG. 10 for ease of illustration. Still other pin configurations can be implemented.

Figure 11:
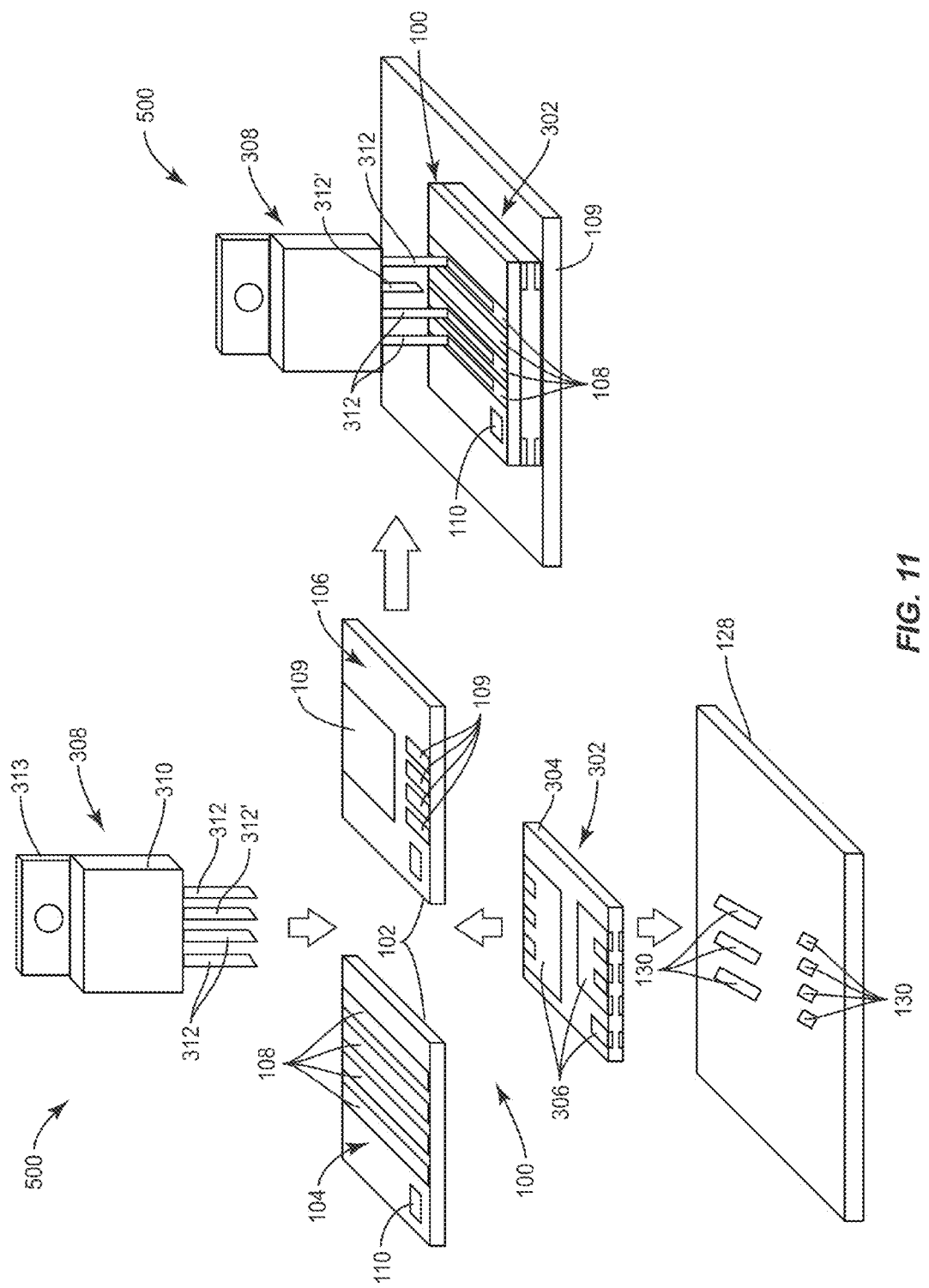
FIG. 11 illustrates exploded and assembled views of yet another embodiment of an interposer with a programmable junction matrix for establishing a vertical connection between semiconductor packages.

FIG. 11 illustrates exploded and assembled views of yet another embodiment of a hybrid stacked arrangement 500 of semiconductor packages using the interposer. The embodiment shown in FIG. 11 is similar to the embodiment shown in FIG. 9, however, the through-hole package 308 has an additional pin 312' such as a source sense pin. This additional pin 312' of the through-hole package 308 remains unconnected to any of the electrical conductors 108 at the top side 104 of the interposer substrate 102. Instead, the additional pin 312' is connected directly to the PCB 128. For example, the fourth pin 312' of the through-hole package 308 can be bent in a plane parallel to the interposer substrate 102 beyond the edge 105 of the substrate 102 and then bent downward towards the PCB 102. This configuration of the additional pin 312' of the through-hole package 308 is not shown in FIG. 10 for ease of illustration. Still other pin configurations can be implemented.

Figure 12:
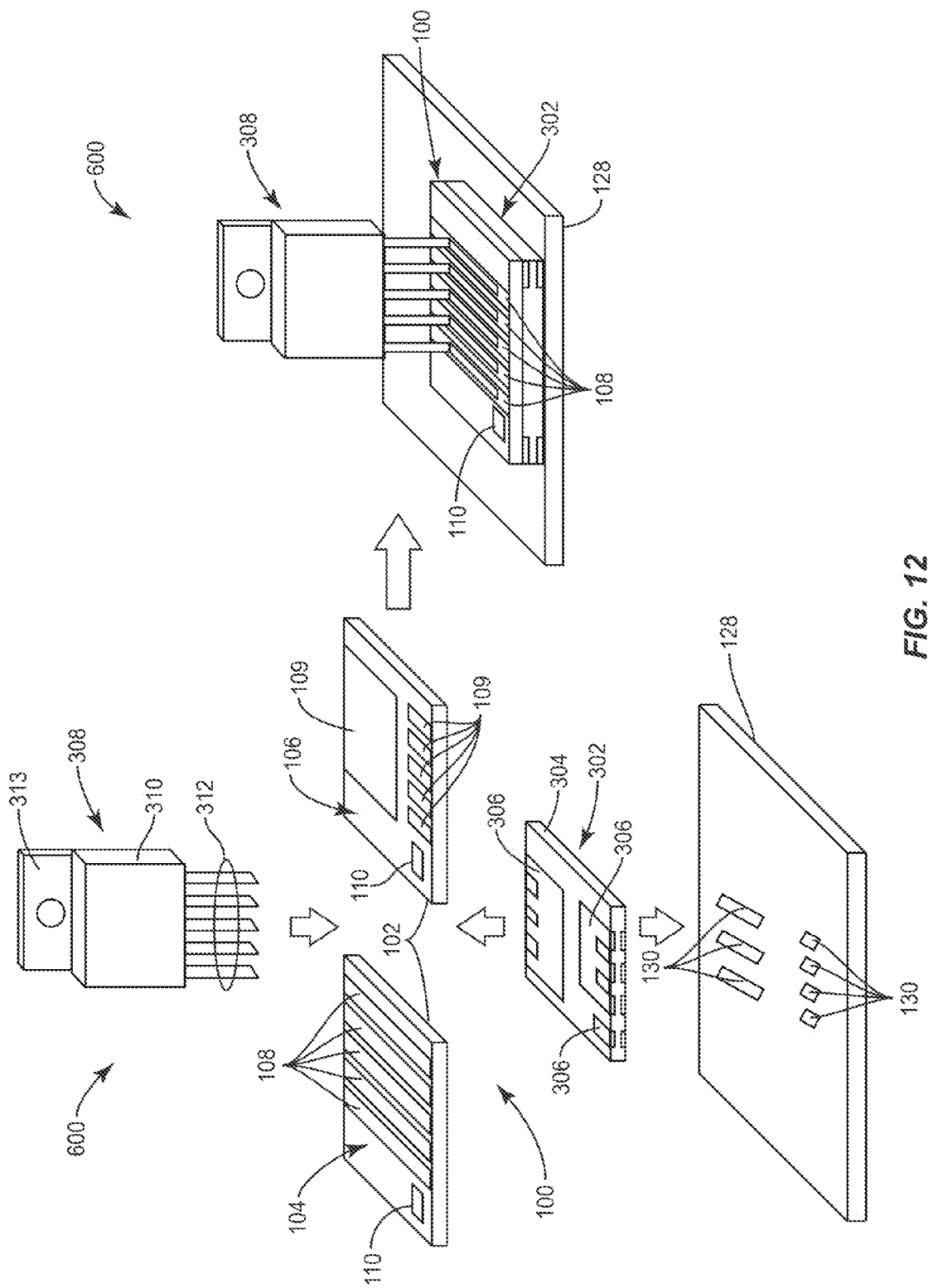
FIG. 12 illustrates exploded and assembled views of still another embodiment of an interposer with a programmable junction matrix for establishing a vertical connection between semiconductor packages.

FIG. 12 illustrates exploded and assembled views of still another embodiment of a hybrid stacked arrangement 600 of semiconductor packages using the interposer. The embodiment shown in FIG. 11 is similar to the embodiment shown in FIG. 9, however, the through-hole package 308 has five pins 312. All five pins 312 of the through-hole package 308 can be connected to respective ones of the electrical conductors 108 at the top side 104 of the interposer substrate 102 as shown in FIG. 11. Alternatively, one or more of the pins 312 can connected directly to the PCB 128 as previously described herein.

FIG. 13 illustrates a side view of an embodiment of a hybrid stacked arrangement 700 of semiconductor packages using the interposer. According to this embodiment, the molding compound 310 of the through-hole package 308 extends perpendicularly away from the top side 104 of the interposer substrate 102 along a length (L) of the molding compound 310.

FIG. 14 illustrates a side view of another embodiment of a hybrid stacked arrangement 800 of semiconductor packages using the interposer. According to this embodiment, the molding compound 310 of the through-hole package 308 contacts the top side 104 of the interposer substrate 102 along a length (L) of the molding compound 310. The footprint of the interposer substrate 102 is larger in this embodiment as compared to the embodiment of FIG. 13 for the same size through-hole package 308 due to the different through-hole package mounting configuration.

FIG. 15, which includes FIGS. 15A through 15C, illustrates an embodiment of a surface-mount package 900 for attachment to the interposer 100 described herein. FIG. 15A shows a bottom plan view of the surface-mount package 900 i.e. the side of the surface-mount package 900 facing away from the interposer substrate 102. FIG. 15B shows a top plan view of the surface-mount package 900 i.e. the side of the surface-mount package attached to the interposer substrate 102. FIG. 15C shows a side view of the surface-mount package 900 i.e. the edge of the surface-mount package 900. The surface-mount package 900 includes exposed leads 902, 904 disposed at both main sides of the surface-mount package 900 i.e. at the side of the package 900 to be attached to the interposer substrate 102 and at the opposite side. The exposed leads 902 at the top side of the surface-mount package 900 have the same footprint as the exposed leads 904 at the bottom side of the surface-mount package 900. A molding compound 906 encases each semiconductor die and the internal connections of the package 900.

FIG. 16, which includes FIGS. 16A through 16E, illustrates an embodiment of a method of manufacturing the surface-mount package 900 of FIG. 15. FIG. 16A shows a lower lead frame 910 with different leads 912 and a die pad 914. The leads 912 and the die pad 914 form the exposed leads 904 at the bottom side of the surface-mount package 900. FIG. 16B shows a semiconductor die 916 attached to the die pad 914 of the lower lead frame 910 e.g. by soldering, advanced diffusion soldering, gluing, etc. Pads 918 at the top side of the die 916 are electrically connected to the leads 912 of the lower lead frame 910 e.g. by electrical conductors 920 such as metal clips, wire bonds, ribbons, etc. FIG. 16C shows solder paste 922 provided on a portion of the leads 912 and die pad 914 of the lower lead frame 910 for subsequently connecting the lower lead frame 9120 to an upper lead frame 924. FIG. 16D shows the upper lead frame 924 connected to the lower lead frame 910 by a soldered connection formed by the solder paste 922. The upper lead frame 924 and the lower lead frame 910 have aligned soldering regions between which the solder paste or other joining material 922 is interposed. The upper lead frame 924 has leads 926 of the identical or nearly identical shape as the leads 912 and die pad 914 of the lower lead frame 910. The leads 926 of the upper lead frame 924 form the exposed leads 902 at the bottom top of the surface-mount package 900. FIG. 16E shows a molding compound 928 that encases the semiconductor die 916 and the internal electrical conductors 920 connected to the pads 918 of the die 916. At least part of the outer surface of the upper and lower lead frames 910, 924 remains uncovered by the molding 928 compound as shown in FIG. 15 to form the exposed leads 902, 904 of the surface-mount package 900. The upper and lower lead frames 910, 924 have the same or similar footprint according to this embodiment, so that the exposed leads 902 at the top side of the surface-mount package 900 have the same footprint as the exposed leads 904 at the bottom side of the surface-mount package 900. Other lead configurations can be used.

Spatially relative terms such as "under", "below", "lower", "over", "upper" and the like, are used for ease of description to explain the positioning of one element relative to a second element. These terms are intended to encompass different orientations of the package in addition to different orientations than those depicted in the figures. Further, terms such as "first", "second", and the like, are also used to describe various elements, regions, sections, etc. and are also not intended to be limiting. Like terms refer to like elements throughout the description.

As used herein, the terms "having", "containing", "including", "comprising" and the like are open-ended terms that indicate the presence of stated elements or features, but do not preclude additional elements or features. The articles "a", "an" and "the" are intended to include the plural as well as the singular, unless the context clearly indicates otherwise.

With the above range of variations and applications in mind, it should be understood that the present invention is not limited by the foregoing description, nor is it limited by the accompanying drawings. Instead, the present invention is limited only by the following claims and their legal equivalents.

What is claimed is:

1. An interposer, comprising: an electrically insulating substrate having a first main side and a second main side opposite the first main side; a plurality of first electrical conductors at the first main side of the substrate, wherein some of the first electrical conductors extend along a surface of the first main side of the substrate to an edge of the substrate between the first and second main sides, extend along a surface of the edge of the substrate, and extend onto a surface of the second main side of the substrate; a plurality of second electrical conductors at the second main side of the substrate; and a programmable connection matrix at one or both main sides of the substrate, the programmable connection matrix comprising programmable junctions configured to open or close electrical connections between different ones of the first electrical conductors and different ones of the second electrical conductors upon programming of the junctions.

2. The interposer of claim 1, wherein the programmable junctions comprise open solder bridges each of which is individually configured to be closed by solder so as to close the electrical connection between one of the first electrical conductors and one of the second electrical conductors.

3. The interposer of claim 1, wherein the programmable junctions comprise fuses each of which is individually configured to be opened by a fuse opening process so as to open the electrical connection between one of the first electrical conductors and one of the second electrical conductors.

4. The interposer of claim 1, wherein the programmable junctions comprise pairs of jumper terminals each pair of which is configured to be connected by a jumper shunt so as to close the electrical connection between one of the first electrical conductors and one of the second electrical conductors.

5. The interposer of claim 1, wherein the interposer is a printed circuit board and the electrically insulating substrate is a laminate.

6. A hybrid stacked arrangement of semiconductor packages, comprising: an interposer, comprising: an electrically insulating substrate having a first main side and a second main side opposite the first main side; a plurality of first electrical conductors at the first main side of the substrate~ wherein some of the first electrical conductors extend along a surface of the first main side of the substrate to an edge of the substrate between the first and second main sides, extend along a surface of the edge of the substrate, and extend onto a surface of the second main side of the substrate; a plurality of second electrical conductors at the second main side of the substrate; and a programmable connection matrix at one or both main sides of the substrate; a first semiconductor package having terminals attached to at least some of the first electrical conductors at the first main side of the substrate; and a second semiconductor package having terminals attached to at least some of the second electrical conductors at the second main side of the substrate, wherein the programmable connection matrix comprises one or more junctions programmed to open or close electrical connections between different ones of the first electrical conductors and different ones of the second electrical conductors so as to electrically connect one or more of the terminals of the first and second semiconductor packages.

7. The hybrid stacked arrangement of semiconductor packages of claim 6, further comprising a plurality of third electrical conductors extending outward from the second main side of the substrate, wherein a first end of the third electrical conductors is connected at the second main side of the substrate to the first electrical conductors that extend onto the second main side.

8. The hybrid stacked arrangement of semiconductor packages of claim 7, further comprising a printed circuit board to which the second semiconductor package is attached at a side of the second semiconductor package facing away from the interposer, the printed circuit board having a patterned metallization connected to terminals at the side of the second semiconductor package attached to the printed circuit board, wherein a second end of the third electrical conductors opposite the first end is connected to the patterned metallization of the printed circuit board.

9. The hybrid stacked arrangement of semiconductor packages of claim 6, wherein each of the one or more programmed junctions comprises an open solder bridge closed by solder so as to close an electrical connection between one of the first electrical conductors and one of the second electrical conductors and thereby electrically connect one of the terminals of the first semiconductor package to one of the terminals of the second semiconductor package.

10. The hybrid stacked arrangement of semiconductor packages of claim 6, wherein each of the one or more programmed junctions comprises an opened fuse so as to open an electrical connection between one of the first electrical conductors and one of the second electrical conductors and thereby electrically disconnect one of the terminals of the first semiconductor package from one of the terminals of the second semiconductor package.

11. The hybrid stacked arrangement of semiconductor packages of claim 6, wherein each of the one or more programmed junctions comprises a pair of jumper terminals connected by a jumper shunt so as to close an electrical connection between one of the first electrical conductors and one of the second electrical conductors and thereby electrically connect one of the terminals of the first semiconductor package to one of the terminals of the second semiconductor package.

12. The hybrid stacked arrangement of semiconductor packages of claim 6, wherein:
the first semiconductor package comprises a normally-on JFET having a gate terminal attached to a first one of the first electrical conductors at the first main side of the substrate, a drain terminal attached to a second one of the first electrical conductors at the first main side of the substrate and a source terminal attached to a third one of the first electrical conductors at the first main side of the substrate;
the second semiconductor package comprises a normally-off MOSFET having a gate terminal attached to a first one of the second electrical conductors at the second main side of the substrate, a drain terminal attached to a second one of the second electrical conductors at the second main side of the substrate and a source terminal attached to a third one of the second electrical conductors at the second main side of the substrate;
a first one of the junctions completes an electrical connection between the first one of the first electrical conductors and the third one of the second electrical conductors so as to electrically connect the gate terminal of the normally-on JFET to the source terminal of the normally-off MOSFET; and
a second one of the junctions completes an electrical connection between the third one of the first electrical conductors and the second one of the second electrical conductors so as to electrically connect the source terminal of the normally-on JFET to the drain terminal of the normally-off MOSFET.

13. The hybrid stacked arrangement of semiconductor packages of claim 6, wherein:
the first semiconductor package comprises a first normally-off MOSFET having a gate terminal attached to a first one of the first electrical conductors at the first main side of the substrate, a drain terminal attached to a second one of the first electrical conductors at the first main side of the substrate and a source terminal attached to a third one of the first electrical conductors at the first main side of the substrate;
the second semiconductor package comprises a second normally-off MOSFET having a gate terminal attached to a first one of the second electrical conductors at the second main side of the substrate, a drain terminal attached to a second one of the second electrical conductors at the second main side of the substrate and a source terminal attached to a third one of the second electrical conductors at the second main side of the substrate; and
a first one of the junctions completes an electrical connection between the third one of the first electrical conductors and the second one of the second electrical conductors so as to electrically connect the source terminal of the first normally-off MOSFET to the drain terminal of the second normally-off MOSFET.

14. The hybrid stacked arrangement of semiconductor packages of claim 6, wherein:
the first semiconductor package comprises a first pair of normally-off MOSFETs connected in a half-bridge configuration and having a power terminal attached to a first one of the first electrical conductors at the first main side of the substrate and a ground terminal attached to a second one of the first electrical conductors at the first main side of the substrate;
the second semiconductor package comprises a second pair of normally-off MOSFETs connected in a half-bridge configuration and having a power terminal attached to a first one of the second electrical conductors at the second main side of the substrate and a ground terminal attached to a second one of the second electrical conductors at the second main side of the substrate;
a first one of the junctions completes an electrical connection between the first one of the first electrical conductors and the first one of the second electrical conductors so as to electrically connect the power terminals of the first and second semiconductor packages; and
a second one of the junctions completes an electrical connection between the second one of the first electrical conductors and the second one of the second electrical conductors so as to electrically connect the ground terminals of the first and second semiconductor packages.

15. A hybrid stacked arrangement of semiconductor packages, comprising: an interposer, comprising: an electrically insulating substrate having a first main side and a second main side opposite the first main side; a plurality of first electrical conductors at the first main side of the substrate; a plurality of second electrical conductors at the second main side of the substrate; and a programmable connection matrix at one or both main sides of the substrate; a first semiconductor package having terminals attached to at least some of the first electrical conductors at the first main side of the substrate, wherein the first semiconductor package is a surface-mount package comprising one or more semiconductor dies encased in a molding compound and having exposed leads embedded in the molding compound and electrically connected to the one or more semiconductor dies, the exposed leads forming the terminals of the first semiconductor package; and a second semiconductor package having terminals attached to at least some of the second electrical conductors at the second main side of the substrate, wherein the second semiconductor package is a through-hole package comprising one or more semiconductor dies encased in a molding compound and pins extending out of the molding compound and electrically connected to the one or more semiconductor dies, the pins forming the terminals of the second semiconductor package, wherein the programmable connection matrix comprises one or more junctions programmed to open or close electrical connections between different ones of the first electrical conductors and different ones of the second electrical conductors so as to electrically connect one or more of the terminals of the first and second semiconductor packages.

16. The hybrid stacked arrangement of semiconductor packages of claim 15, wherein one or more of the pins of the through-hole package remain unconnected to any of the second electrical conductors at the second main side of the substrate.

17. The hybrid stacked arrangement of semiconductor packages of claim 6, further comprising a printed circuit board to which the second semiconductor package is attached at a side of the second semiconductor package facing away from the interposer, the printed circuit board having a patterned metallization connected to terminals at the side of the second semiconductor package attached to the printed circuit board.

18. The hybrid stacked arrangement of semiconductor packages of claim 6, wherein the interposer is a printed circuit board and the electrically insulating substrate is a laminate.

19. The hybrid stacked arrangement of semiconductor packages of claim 15, wherein the exposed leads of the surface-mount package are disposed at a first main side of the surface-mount package which faces the interposer, wherein the surface-mount package further comprises exposed leads at a second main side of the surface-mount package opposite the first main side, and wherein the exposed leads at the first main side of the surface-mount package have the same footprint as the exposed leads at the second main side of the surface-mount package.

* * * * *